United States Patent
Ma et al.

(10) Patent No.: US 9,982,865 B2
(45) Date of Patent: May 29, 2018

(54) PARALLEL-CONNECTED LED ILLUMINANT AND LED LIGHT LAMP

(71) Applicant: Shandong Prosperous Star Optoelectronics Co., Ltd., Taian (CN)

(72) Inventors: Wenbo Ma, Taian (CN); Yiping Kong, Taian (CN); Xincheng Yuan, Taian (CN); Minkang Zhou, Taian (CN)

(73) Assignee: SHANDONG PROSPEROUS STAR OPTOELECTRONICS CO., LTD., Taian (CN)

( * ) Notice: Subject to any disclaimer, the term of this patent is extended or adjusted under 35 U.S.C. 154(b) by 86 days.

(21) Appl. No.: 15/060,541

(22) Filed: Mar. 3, 2016

(65) Prior Publication Data
US 2017/0167667 A1    Jun. 15, 2017

(30) Foreign Application Priority Data
Dec. 10, 2015   (CN) .......................... 2015 1 0910158

(51) Int. Cl.
| | | |
|---|---|---|
| *F21V 21/00* | (2006.01) | |
| *F21V 3/00* | (2015.01) | |
| *F21K 9/232* | (2016.01) | |
| *F21Y 115/10* | (2016.01) | |
| *F21Y 113/13* | (2016.01) | |
| *F21Y 107/00* | (2016.01) | |
| *H01L 25/075* | (2006.01) | |

(52) U.S. Cl.
CPC ................ *F21V 3/00* (2013.01); *F21K 9/232* (2016.08); *F21Y 2107/00* (2016.08); *F21Y 2113/13* (2016.08); *F21Y 2115/10* (2016.08); *H01L 25/0753* (2013.01)

(58) Field of Classification Search
CPC ........... F21V 21/30; F21V 15/01; F21V 7/005
USPC .................... 362/225, 260, 249.02, 800, 219
See application file for complete search history.

(56) References Cited

U.S. PATENT DOCUMENTS

| | | | | |
|---|---|---|---|---|
| 4,520,436 A | * | 5/1985 | McNair ...................... | F21S 8/02 313/113 |
| 5,434,762 A | * | 7/1995 | Shemitz .................... | F21S 2/00 362/225 |
| 5,758,952 A | * | 6/1998 | Getselis ..................... | F21S 8/00 362/217.09 |

* cited by examiner

*Primary Examiner* — Jamara Franklin
(74) *Attorney, Agent, or Firm* — Matthias Scholl, PC; Matthias Scholl

(57) ABSTRACT

A parallel-connected LED illuminant, including: a parallel-connected bracket, LED light emitting unit groups, and fluorescent powder layers. The parallel-connected bracket includes two or more than two linear substrate monomers. The linear substrate monomers are disposed in parallel. Each of the LED light emitting unit groups is disposed in the straight line on each of the linear substrate monomers along the long axis thereof. The LED illuminant is connected in series with electrode pins disposed at two ends of the parallel-connected bracket. The surface of each linear substrate monomer where each LED light emitting unit group is disposed is coated with each of the fluorescent powder layers.

16 Claims, 3 Drawing Sheets

PARALLEL-CONNECTED LED ILLUMINANT AND LED LIGHT LAMP

CROSS-REFERENCE TO RELATED APPLICATIONS

Pursuant to 35 U.S.C. § 119 and the Paris Convention Treaty, this application claims the benefit of Chinese Patent Application No. 201510910158.7 filed Dec. 10, 2015, the contents of which are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

This invention relates to a parallel-connected LED illuminant and an LED light lamp.

Description of the Related Art

A typical packaging form for the filament LED has the following problems: 1) LED filament features relatively low power capacity, complicated filament welding, low efficiency, and high product cost; 2) the product has poor thermal dissipation, short service life, and fails to be driven by large current; and 3) side leakage of blue light exists in the filament.

SUMMARY OF THE INVENTION

In view of the above-described problems, it is one objective of the invention to provide a parallel-connected LED illuminant and an LED light lamp which feature high power capacity, high productivity, good thermal dissipation, long service life, and low cost.

To achieve the above objective, in accordance with one embodiment of the invention, there is provided a parallel-connected LED illuminant comprising: a parallel-connected bracket, the parallel-connected bracket comprising two or more than two linear substrate monomers; LED light emitting unit groups; and fluorescent powder layers. The linear substrate monomers are disposed in parallel. Each of the LED light emitting unit groups is disposed in a straight line on each of the linear substrate monomers along the long axis thereof. The LED illuminant is connected in series with electrode pins disposed at two ends of the parallel-connected bracket. A surface of each linear substrate monomer where each LED light emitting unit group is disposed is coated with each fluorescent powder layer.

In a class of this embodiment, the LED light emitting unit groups disposed on different linear substrate monomers are on a same side of the parallel-connected bracket.

In a class of this embodiment each of the LED light emitting unit groups comprises multiple LED light emitting units, and the light emitting units are connected in series. The LED light emitting unit groups disposed on the different linear substrate monomers are in parallel connection.

In a class of this embodiment, the LED light emitting unit is selected from the group consisting of a blue light LED chip, a red light LED chip, a green light LED chip, a yellow light LED chip, a purple light LED chip, and a combination thereof.

In a class of this embodiment, the linear substrate monomer is made of a material having a high heat conductivity coefficient. The material having the high heat conductivity coefficient is a metallic material or a ceramic material.

In a class of this embodiment, the linear substrate monomer is between 5 and 200 mm in length, between 0.3 and 5 mm in width, and between 0.1 and 3 mm in thickness. Preferably, the linear substrate monomer is between 10 and 100 mm in length, between 0.5 and 2 mm in width, and between 0.2 and 1 mm in thickness.

In a class of this embodiment, a space between adjacent linear substrate monomers disposed on the parallel-connected bracket is between 0.1 and 20 mm, and preferably between 0.2 and 5 mm.

In a class of this embodiment, two sides of each of the linear substrate monomers along the long axis is a plane, corrugated, or serrated structure.

In a class of this embodiment, each fluorescent powder layer fully covers surfaces of the LED light emitting units of each linear substrate monomer. A contour of a cross section of each fluorescent powder layer is semicircular, semielliptical, or rectangular. A material of the fluorescent powder layer is a yellow powder or a yellow green powder under a YAG series; a yellow powder, a yellow green powder, or an orange powder under a silicate series; a red powder under a nitride or nitric oxide series; or a combination under fluorescent powder of different series.

In accordance with another embodiment of the invention, there is provided an LED light lamp. The LED light lamp comprises: a sealed transparent bulb shell, a light source, and a gaseous medium. Both the light source and the gaseous medium are disposed in the transparent bulb shell. The light source adopts the parallel-connected LED illuminant as described in the above. The gaseous medium is helium, hydrogen, or a mixture thereof. In the mixture of helium and hydrogen, a preferred volume ratio of helium to hydrogen is 95:5.

Advantages of the parallel-connected LED illuminant and the LED light lamp according to embodiments of the invention are summarized as follows:

1) The bracket of LED illuminant is formed by connecting two or more than two linear substrate monomers in parallel, which significantly enlarges the effective heat dissipation area of the LED illuminant composed of single linear substrate monomer. As the fluorescent powder layer only covers on the surface of each linear substrate monomer where the LED light emitting unit is disposed, whereas other surfaces of the linear substrate monomer is not coated with the fluorescent powder layer having poor thermal conductivity, so that other surfaces can directly contact with external thermal dissipation gas to realize thermal exchange, thus significantly prolonging the service life of LED light lamp. 2) The parallel-connected LED illuminant provided in this invention can bear higher power. 3) The bracket of LED illuminant is formed by connecting two or more than two linear substrate monomers in parallel, which can reduce the welding times during production, enhance welding efficiency, and lower production cost.

BRIEF DESCRIPTION OF THE DRAWINGS

The invention is described hereinbelow with reference to the accompanying drawings, in which.

Figure 1:
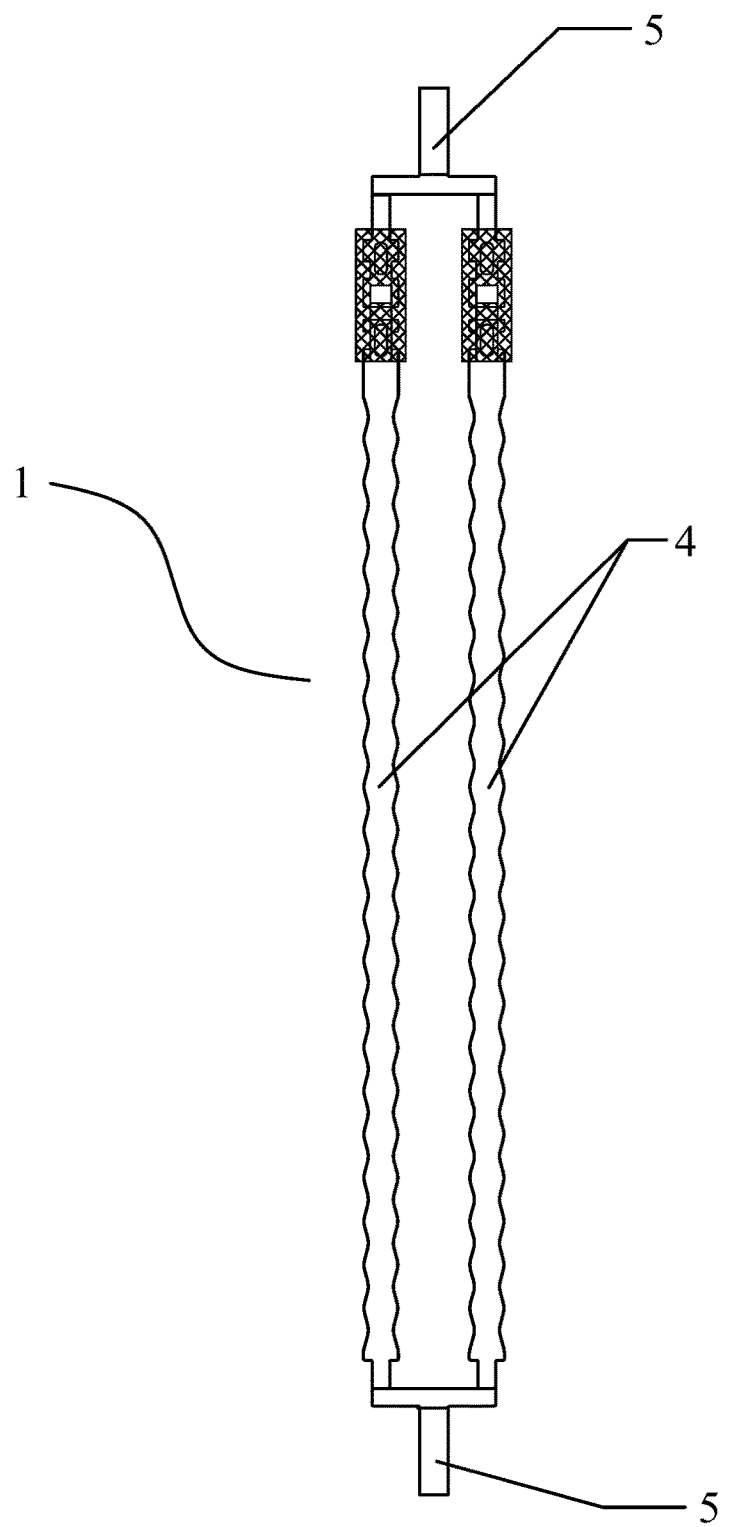
FIG. 1 is a structure diagram of a parallel-connected bracket according to one embodiment of the invention.

In the drawings, the following reference numbers are used: 1. Parallel-connected bracket; 2. LED light emitting unit; 3. Fluorescent powder; 4. Linear substrate monomer; 5. Electrode pin; 6. LED light emitting unit group; and 10. Parallel-connected LED illuminant.

DETAILED DESCRIPTION OF THE EMBODIMENTS

For further illustrating the invention, experiments detailing a parallel-connected LED illuminant and an LED light lamp are described below. It should be noted that the following examples are intended to describe and not to limit the invention.

Figure 2:
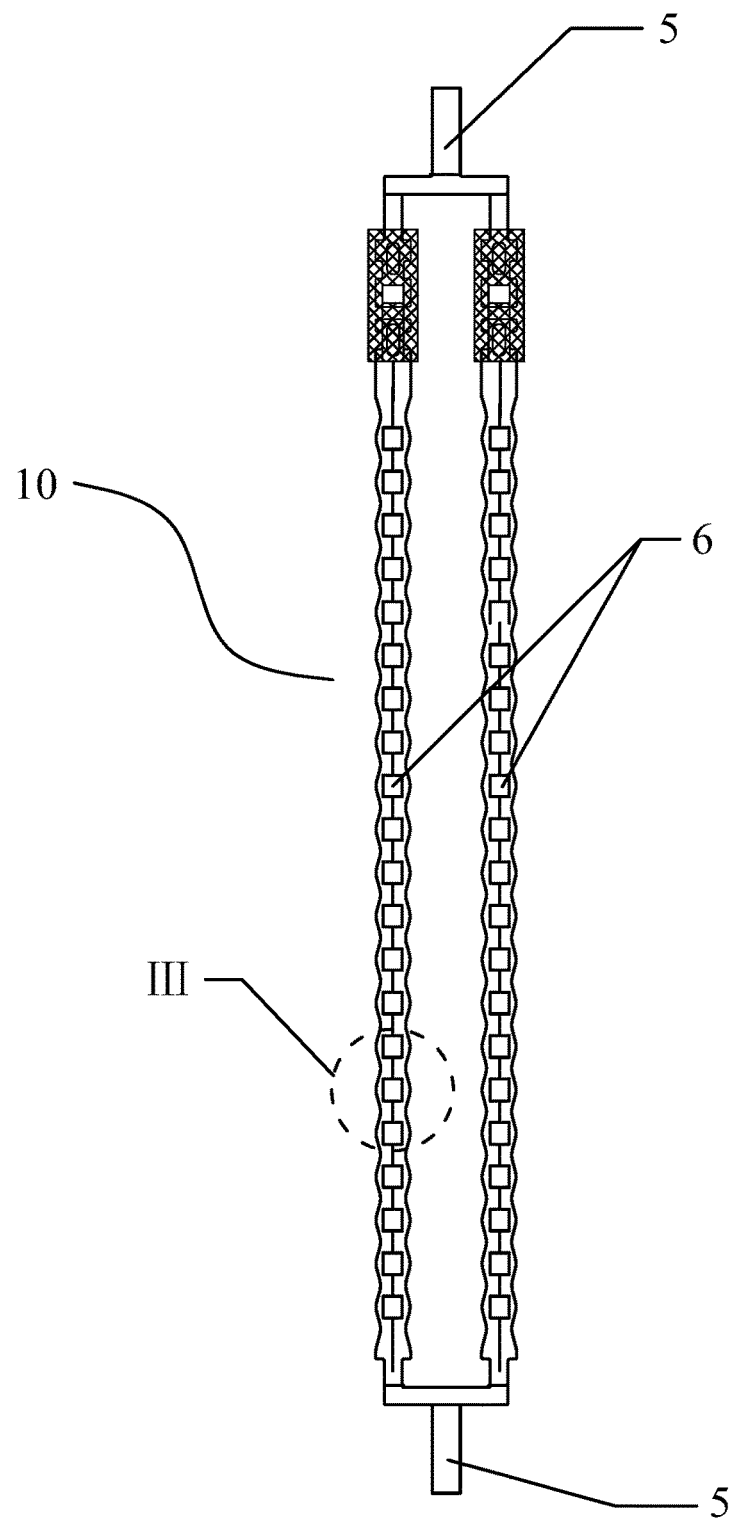
FIG. 2 is a structure diagram of a parallel-connected LED illuminant according to one embodiment of the invention.
Figure 3:
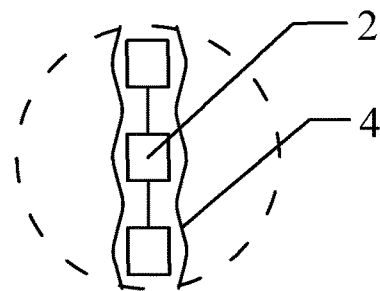
FIG. 3 is an enlarged view of a Part III of FIG. 2.

As shown in FIG. 1 and FIG. 2, this invention provides a parallel-connected LED illuminant 10 comprising: a parallel-connected bracket 1, LED light emitting unit groups 6, and fluorescent powder layers 3. The parallel-connected bracket comprises two or more than two paralleled linear substrate monomers 4. The linear substrate monomers 4 are disposed in parallel. Each of the LED light emitting unit groups 6 comprises LED light emitting units 2; and the LED light emitting units 2 are connected in series. Each of the LED light emitting unit groups 6 is arranged in a straight line on each linear substrate monomer 4 along a long axis of linear substrate monomer 4. The LED light emitting unit groups 6 disposed on different linear substrate monomers 4 are in parallel connection. The LED illuminant 10 is connected in series with electrode pins 5 disposed at two ends of the parallel-connected bracket 1. A surface of each linear substrate monomer 4 where each LED light emitting unit group 6 is disposed is coated with each fluorescent powder layer 3.

In this embodiment, the LED light emitting unit groups 6 disposed on the different linear substrate monomers 4 are on a same side of the parallel-connected bracket 1, as shown in FIG. 2. Each of the LED light emitting units is selected from the group consisting of a blue light LED chip, a red light LED chip, a green light LED chip, a yellow light LED chip, a purple light LED chip, and a combination thereof. The linear substrate monomer 4 of the parallel-connected bracket 1 is made of a material having a high heat conductivity coefficient. The material having the high heat conductivity coefficient can be a metallic copper material, a metallic iron material, or a ceramic material. Each linear substrate monomer 4 has a length of 30 mm, a width of 1 mm, and a thickness of 0.4 mm. A width between adjacent linear substrate monomers 4 that form the parallel-connected bracket 1 is 1 mm, and no filler is disposed in a space between the adjacent linear substrate monomers 4. In other embodiments, a transparent resin can be used to fill the space between adjacent linear substrate monomers 4. Two sides of each linear substrate monomer 4 of the parallel-connected bracket 1 along the long axis thereof are processed into a corrugated or indented concave-convex repetition structure. In other embodiments, the two sides of each linear substrate monomer 4 of the parallel-connected bracket 1 along the long axis thereof adopt a plane structure.

A number of LED light emitting units 2 is 28. Each of the two linear substrate monomers 4 is provided with 14 LED light emitting units, respectively, and the LED light emitting units are all disposed on the two linear substrate monomers 4 on the same side of the parallel-connected bracket 1. The 14 LED light emitting units 2 disposed on each of the two linear substrate monomers 4 are arranged in a straight line on the surface of linear substrate monomers 4 along the long axis thereof and are connected in series respectively.

Figure 4:
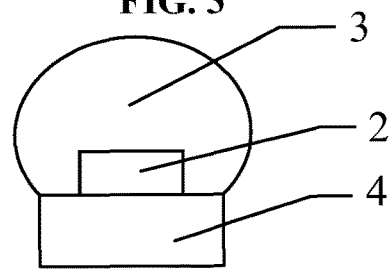
FIG. 4 is a cross sectional view of a linear substrate monomer of a parallel-connected LED illuminant according to one embodiment of the invention.
Figure 5:
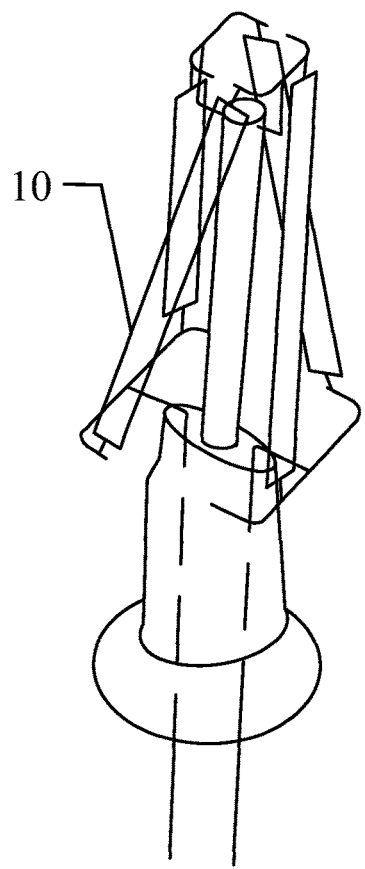
FIG. 5 is an effect diagram of a parallel-connected LED illuminant in the absence of a bulb shell.

In this embodiment, the surface of each linear substrate monomer 4 provided with the LED light emitting unit units 2 is coated with the fluorescent powder layer 3. A contour of a cross section of the fluorescent powder layer 3 is a semicircle, as shown in FIG. 4. The contour of the cross section of the fluorescent powder layer can also be semielliptical, rectangular, or other shapes. The fluorescent powder layer 3 absorbs a part of a blue light and emits a yellow light having a longer wavelength. The yellow light is mixed with the remaining blue light according to a certain proportion to produce a white light having different color temperatures and color rendering indexes. A material of the fluorescent powder layer 3 is a yellow powder or a yellow green powder under a YAG series; a yellow powder, a yellow green powder, or an orange powder under a silicate series; a red powder under a nitride or nitric oxide series; or a combination under fluorescent powder of different series.

An LED light lamp based on the parallel-connected LED illuminant is also provided. The LED light lamp comprises: a sealed transparent bulb shell (preferred a glass shell), a light source disposed in the glass shell, a gaseous medium filled in the glass shell that has high thermal conductivity, such as helium, hydrogen, or a mixture thereof. In particular, the light source welded on a stem adopts the above parallel-connected LED illuminant.

The appearance of LED light lamp can set as bulb lamp, a candle lamp, and a U-shaped lamp tube, etc. Through good thermal conducting characteristics of the metal substrate on the parallel-connected LED illuminant, the metal substrate directly contacts helium in the glass shell to realize thermal exchange and achieve a good thermal dissipation effect, thus, the reliability of LED light lamp is improved, and the LED chip is able to acquire much high luminous flux or lumen value driven by higher current, thereby greatly reduce the cost per unit lumen.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A parallel-connected LED illuminant, comprising:
   a) a parallel-connected bracket, the parallel-connected bracket comprising two or more than two linear substrate monomers;
   b) LED light emitting unit groups; and
   c) fluorescent powder layers;
   wherein
   the linear substrate monomers are disposed in parallel with respect to each other;
   each of the LED light emitting unit groups is disposed in a straight line on each of the linear substrate monomers along a long axis thereof;
   the LED illuminant is connected in series with electrode pins disposed at two ends of the parallel-connected bracket; and
   a surface of each linear substrate monomer where each LED light emitting unit group is disposed is coated with each of the fluorescent powder layers.

2. The illuminant of claim 1, wherein the LED light emitting unit groups disposed on different linear substrate monomers are on a same side of the parallel-connected bracket.

3. The illuminant of claim 2, wherein
each of the LED light emitting unit groups comprises multiple LED light emitting units, and the light emitting units are connected in series; and
the LED light emitting unit groups disposed on the different linear substrate monomers are in parallel connection.

4. The illuminant of claim 3, wherein the LED light emitting unit is selected from the group consisting of a blue light LED chip, a red light LED chip, a green light LED chip, a yellow light LED chip, a purple light LED chip, and a combination thereof.

5. The illuminant of claim 4, wherein the linear substrate monomer is made of a metallic material or a ceramic material.

6. The illuminant of claim 5, wherein the linear substrate monomer is between 5 and 200 mm in length, between 0.3 and 5 mm in width, and between 0.1 and 3 mm in thickness; and a space between adjacent linear substrate monomers disposed on the parallel-connected bracket is between 0.1 and 20 mm.

7. The illuminant of claim 5, wherein two sides of each of the linear substrate monomers along the long axis is a plane, corrugated, or serrated structure.

8. The illuminant of claim 7, wherein
a contour of a cross section of each fluorescent powder layer is semicircular, semielliptical, or rectangular; and
a material of the fluorescent powder layer is a yellow powder or a yellow green powder under a YAG series; a yellow powder, a yellow green powder, or an orange powder under a silicate series; or a red powder under a nitride or nitric oxide series.

9. An LED light lamp, comprising:
a) a sealed transparent bulb shell;
b) a parallel-connected LED illuminant serving as a light source, the parallel-connected LED illuminant comprising: a parallel-connected bracket comprising two or more than two linear substrate monomers, LED light emitting unit groups, and fluorescent powder layers; and
c) a gaseous medium;
wherein
both the light source and the gaseous medium is disposed in the transparent bulb shell;
the linear substrate monomers are disposed in parallel with respect to each other;
each of the LED light emitting unit groups is disposed in a straight line on each of the linear substrate monomers along a long axis thereof;
the LED illuminant is connected in series with electrode pins disposed at two ends of the parallel-connected bracket;
a surface of each linear substrate monomer where each LED light emitting unit group is disposed is coated with each fluorescent powder layer; and
the gaseous medium is helium, hydrogen, or a mixture thereof.

10. The lamp of claim 9, wherein the LED light emitting unit groups disposed on different linear substrate monomers are on a same side of the parallel-connected bracket.

11. The lamp of claim 10, wherein
each of the LED light emitting unit groups comprises multiple LED light emitting units, and the light emitting units are connected in series; and
the LED light emitting unit groups disposed on the different linear substrate monomers are in parallel connection.

12. The lamp of claim 11, wherein the LED light emitting unit is selected from the group consisting of a blue light LED chip, a red light LED chip, a green light LED chip, a yellow light LED chip, a purple light LED chip, and a combination thereof.

13. The lamp of claim 12, wherein the linear substrate monomer is made of a metallic material or a ceramic material.

14. The lamp of claim 12, wherein the linear substrate monomer is between 5 and 200 mm in length, between 0.3 and 5 mm in width, and between 0.1 and 3 mm in thickness; and a space between adjacent linear substrate monomers disposed on the parallel-connected bracket is between 0.1 and 20 mm.

15. The lamp of claim 13, wherein two sides of each of the linear substrate monomers along the long axis is a plane, corrugated, or serrated structure.

16. The lamp of claim 15, wherein
a contour of a cross section of each fluorescent powder layer is semicircular, semielliptical, or rectangular; and
a material of the fluorescent powder layer is a yellow powder or a yellow green powder under a YAG series; a yellow powder, a yellow green powder, or an orange powder under a silicate series; or a red powder under a nitride or nitric oxide series.

* * * * *